US010271466B1

(12) United States Patent
Wu

(10) Patent No.: US 10,271,466 B1
(45) Date of Patent: Apr. 23, 2019

(54) HEAT DISSIPATION MODULE, DISPLAY DEVICE HAVING THE SAME, PORTABLE ELECTRONIC DEVICE HAVING THE SAME AND ASSEMBLING METHOD FOR DISPLAY DEVICE HAVING THE SAME

(71) Applicant: GETAC TECHNOLOGY CORPORATION, Hsinchu County (TW)

(72) Inventor: Chi-Jung Wu, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 15/916,157

(22) Filed: Mar. 8, 2018

(30) Foreign Application Priority Data

Oct. 13, 2017 (CN) .......................... 2017 1 0950132

(51) Int. Cl.
| | |
|---|---|
| *H05K 7/20* | (2006.01) |
| *G03B 21/16* | (2006.01) |
| *F28D 15/02* | (2006.01) |
| *G03B 21/20* | (2006.01) |
| *F28F 21/08* | (2006.01) |

(52) U.S. Cl.
CPC ..... *H05K 7/20963* (2013.01); *F28D 15/0241* (2013.01); *G03B 21/16* (2013.01); *G03B 21/20* (2013.01); *H05K 7/20145* (2013.01); *H05K 7/20972* (2013.01); *F28F 21/08* (2013.01)

(58) Field of Classification Search
CPC .......... H05K 7/20963; H05K 7/20145; H05K 7/20972; H05K 7/20336; H05K 7/20663; F28D 15/0241; G03B 21/20; G03B 21/16; F28F 21/08; G06F 1/20; G06F 1/203; G06F 2200/201; H01L 23/427; F21V 29/006; F21V 29/51; H01H 2009/523

USPC .......... 361/679.27, 679.52, 679.55, 688, 700
See application file for complete search history.

(56) References Cited

U.S. PATENT DOCUMENTS

| | | | | |
|---|---|---|---|---|
| 5,880,929 A | * | 3/1999 | Bhatia ..................... | G06F 1/203 165/104.33 |
| 6,392,883 B1 | * | 5/2002 | Ali .......................... | G06F 1/203 165/185 |
| 8,235,096 B1 | * | 8/2012 | Mahefkey ............. | F28D 15/046 165/104.26 |
| 8,736,788 B2 | * | 5/2014 | Kim ..................... | G02B 6/0055 349/67 |

(Continued)

*Primary Examiner* — Anatoly Vortman
*Assistant Examiner* — Stephen S Sul

(57) ABSTRACT

A portable electronic device includes a body and a display device connected to the body. The display device includes a display panel, an optical module, and a heat dissipation module including a vapor chamber and a light-emitting module. The vapor chamber has flow channels extending from a bottom side to a top side of the vapor chamber and working fluids capable of displacement therein. The light-emitting module is disposed at the bottom side. A rear frame element of the display device has a front bezel onto which the display panel is embedded and a rear receptacle. The front frame element is coveringly disposed at the rear frame element and presses against the display panel. First screwing elements screw the vapor chamber and the rear frame element together. Second screwing elements screw the vapor chamber, the front frame element, and the rear frame element together sequentially.

7 Claims, 12 Drawing Sheets

(56) References Cited

U.S. PATENT DOCUMENTS

| | | | |
|---|---|---|---|
| 9,148,979 B2* | 9/2015 | Chiriac | G06F 1/203 |
| 9,547,344 B2* | 1/2017 | Han | G06F 1/203 |
| 2002/0113919 A1* | 8/2002 | Liu | G02F 1/133382 |
| | | | 349/65 |
| 2006/0181670 A1* | 8/2006 | Kurokawa | G02F 1/133308 |
| | | | 349/161 |
| 2008/0170400 A1* | 7/2008 | Maruyama | G02F 1/133603 |
| | | | 362/294 |
| 2009/0009974 A1* | 1/2009 | Tseng | G02F 1/133382 |
| | | | 361/711 |
| 2010/0073863 A1* | 3/2010 | Matsushima | H05K 7/20245 |
| | | | 361/679.46 |
| 2012/0293719 A1* | 11/2012 | Negoro | G02B 6/0068 |
| | | | 348/725 |
| 2015/0119111 A1* | 4/2015 | Honmura | G06F 1/203 |
| | | | 455/566 |
| 2016/0139464 A1* | 5/2016 | Kawata | G02F 1/133608 |
| | | | 362/97.1 |
| 2018/0263138 A1* | 9/2018 | Wu | H05K 7/2099 |

* cited by examiner

HEAT DISSIPATION MODULE, DISPLAY DEVICE HAVING THE SAME, PORTABLE ELECTRONIC DEVICE HAVING THE SAME AND ASSEMBLING METHOD FOR DISPLAY DEVICE HAVING THE SAME

CROSS REFERENCE TO RELATED APPLICATIONS

This Application claims priority of China Patent Application No. 201710950132.4 filed on Oct. 13, 2017, the entirety of which is incorporated by reference herein.

BACKGROUND OF THE INVENTION

Field of the Invention

The present invention relates to a heat dissipation module, a display device having the same, a portable electronic device having the same and a method of assembling a display device having the same.

Description of the Prior Art

A conventional display device of an electronic device essentially displays images by joint operations of a light source and a light-guiding component. The light source of the display device generates heat while in operation. A heat dissipation mechanism of the display device is important, as it ensures that the heat generated from the light source of the display device will not affect functions thereof.

The heat dissipation mechanism of the display device includes a metal plate in the rear of the display device to achieve heat dissipation because of the high thermal conductivity of the metal plate. However, to meet users' mounting expectations for size and brightness of the display device, light sources are increased, leading to an increase in power consumed by the display device and heat generated therefrom. As a result, the metal plate-based heat dissipation mechanism of the display device does not suffice.

SUMMARY OF THE INVENTION

The present invention provides a heat dissipation module, a display device having the same, a portable electronic device having the same and a method of assembling a display device having the same, and is aimed at improving a heat dissipation mechanism of a light-emitting module.

The heat dissipation module of the present invention comprises a vapor chamber and a light-emitting module. The vapor chamber has a plurality of channels and a plurality of working fluids undergoing cyclic evaporation and condensation in the plurality of channels. The plurality of channels each extend from a bottom edge of the vapor chamber to a top edge of the vapor chamber. The light-emitting module is disposed at the bottom edge.

The display device of the present invention comprises a display panel, an optical module, and the heat dissipation module. The optical module is superimposed on the display panel. The heat dissipation module is superimposed on the optical module.

The portable electronic device of the present invention comprises the body and the display device. The body has a pivotal connection portion. The display device is pivotally connected to the pivotal connection portion.

As soon as the display device pivotally rotates and moves away from the body to therefore become in use, the channels of the heat dissipation module become upright spontaneously, and in consequence the liquid working fluids converge quickly at the bottom edge under gravity. When they come into contact with the light-emitting module at the bottom edge, the liquid working fluids evaporate and turn into the gaseous working fluids. The gaseous working fluids rise and go to the top edge. Therefore, the working fluids undergo evaporation and condensation cyclically and quickly, thereby cooling the display device.

The method of assembling of a display device comprises the steps of: mounting a display panel and an optical module on a rear frame element; fitting a front frame element around the rear frame element; fixing a light-emitting module to a bottom edge of a vapor chamber, wherein the vapor chamber has a plurality of channels and a plurality of working fluids undergoing cyclic evaporation and condensation in the plurality of channels, the plurality of channels each extending from the bottom edge of the vapor chamber to a top edge of the vapor chamber; and mounting the vapor chamber on the front frame element or the rear frame element.

The display panel and the optical module are mounted on the rear frame element, and then the vapor chamber is mounted on the front frame element or the rear frame element. The vapor chamber is independent of the display panel and the optical module during the assembly process, thereby facilitating assembly and maintenance.

DETAILED DESCRIPTION OF THE EMBODIMENTS

Figure 1:
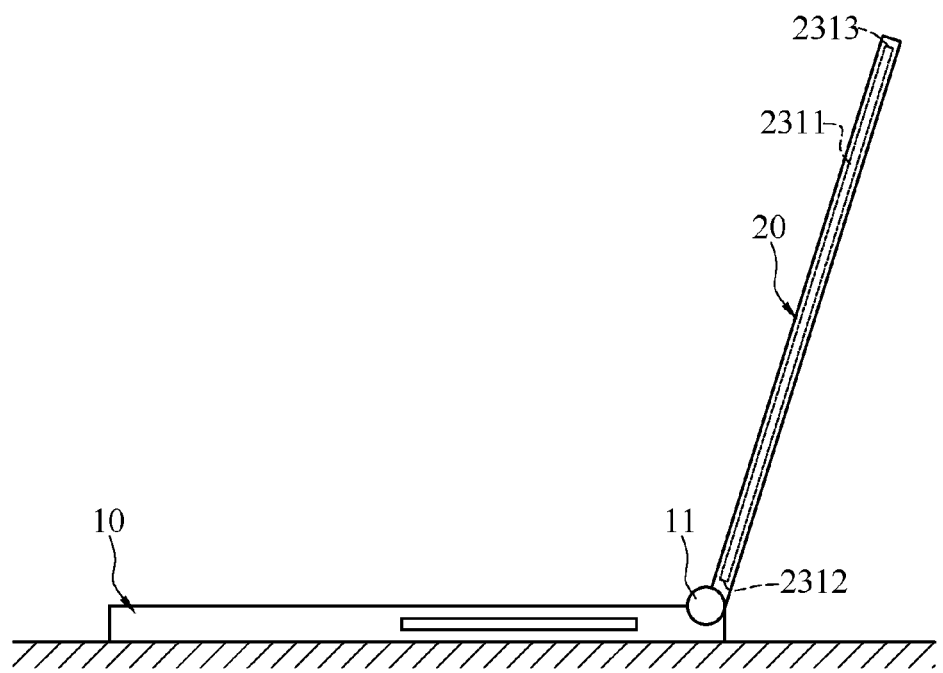
FIG. 1 is a schematic view of operation of a portable electronic device according to an embodiment of the present invention.

Referring to FIG. 1, there is shown a schematic view of operation of a portable electronic device according to an embodiment of the present invention. As shown in FIG. 1, the portable electronic device comprises a body 10 and a display device 20. A pivotal connection portion 11 is disposed at one edge of the body 10. The display device 20 is pivotally connected to the pivotal connection portion 11 of the body 10 and thus uses the pivotal connection portion 11 as a pivot to open and shut relative to the body 10, so as to form a notebook-style portable electronic device.

Figure 2:
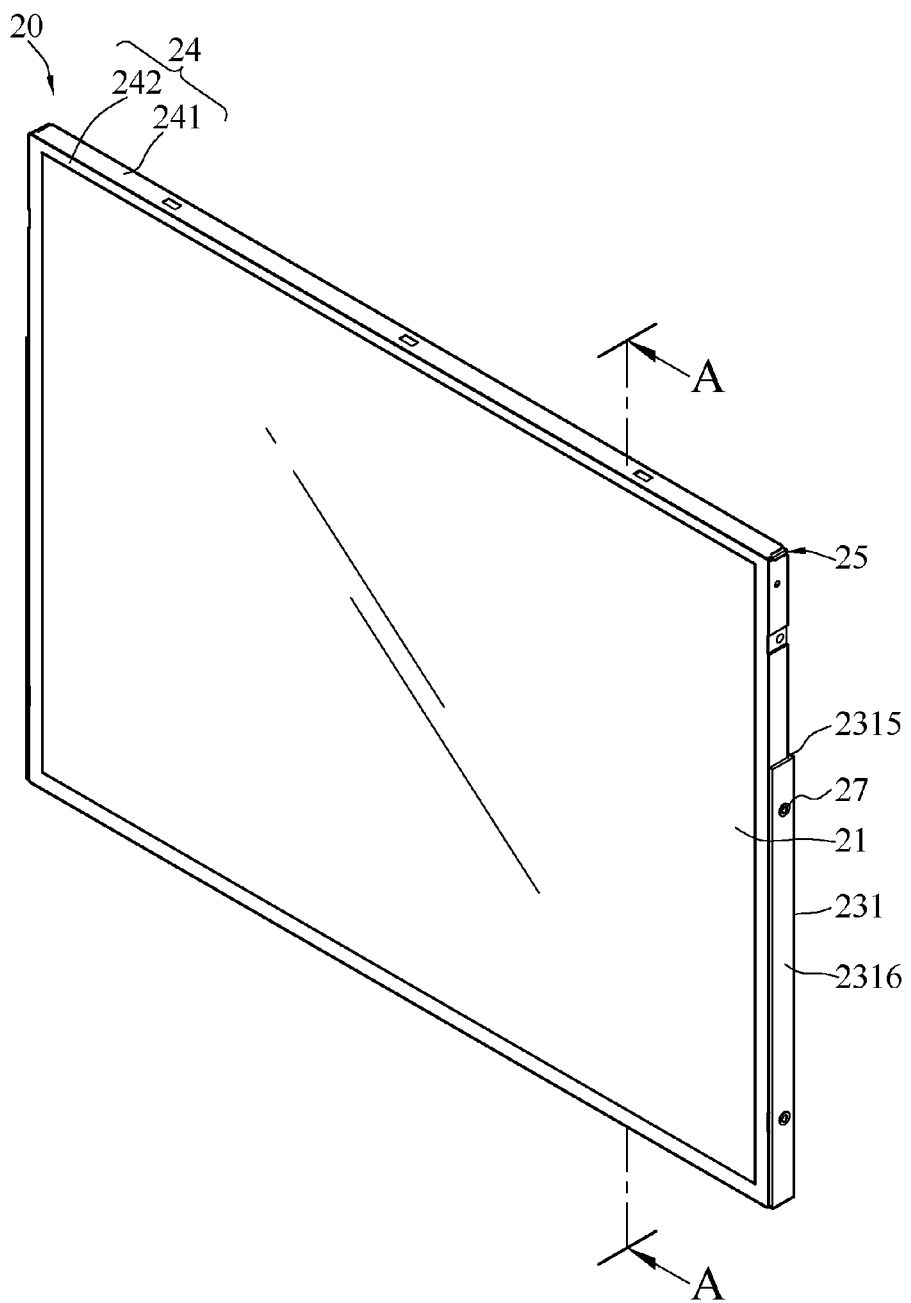
FIG. 2 is a perspective view of a display device of the portable electronic device according to an embodiment of the present invention.
Figure 3:
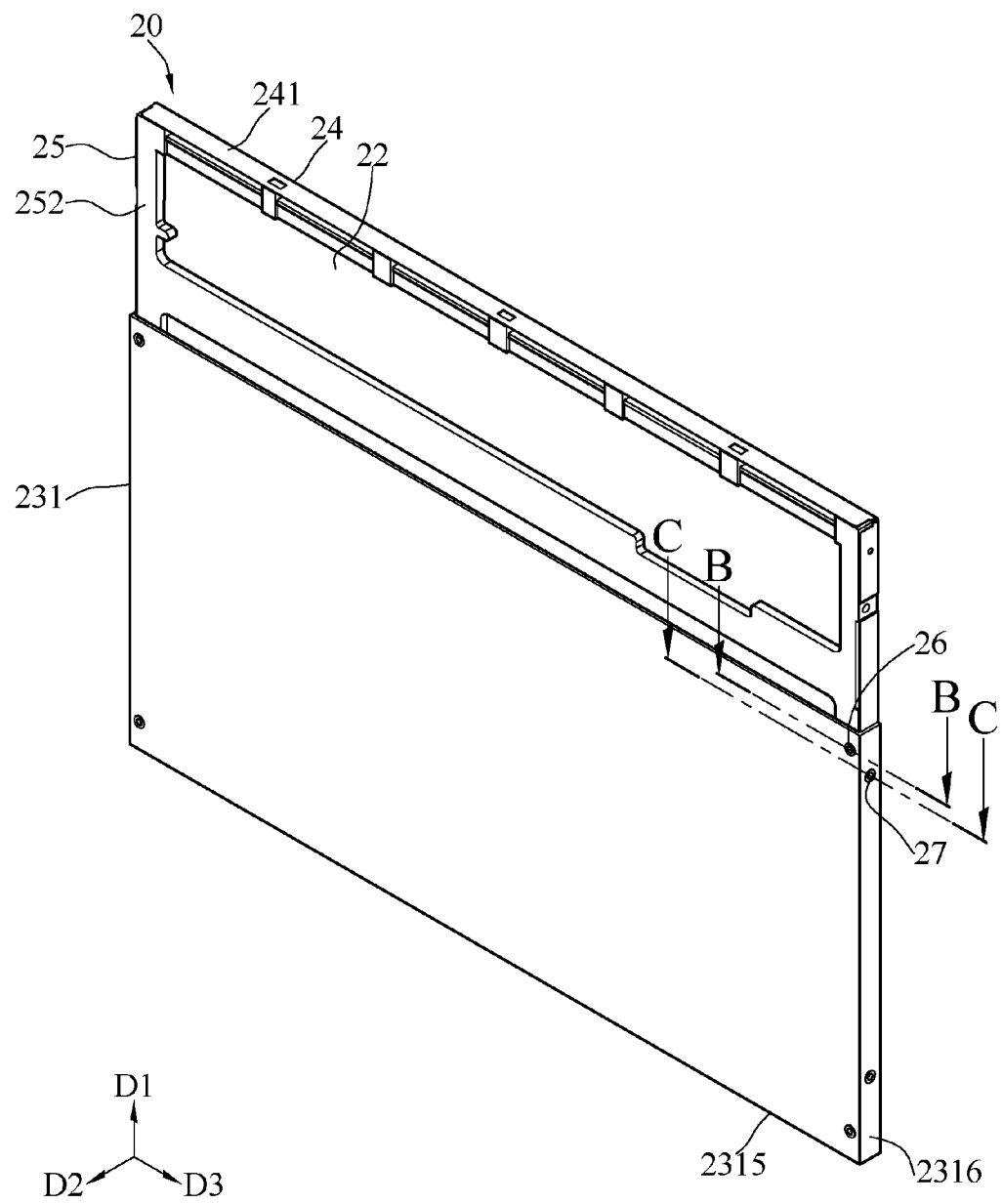
FIG. 3 is a perspective view from a different angle of the display device of the portable electronic device according to an embodiment of the present invention.
Figure 4:
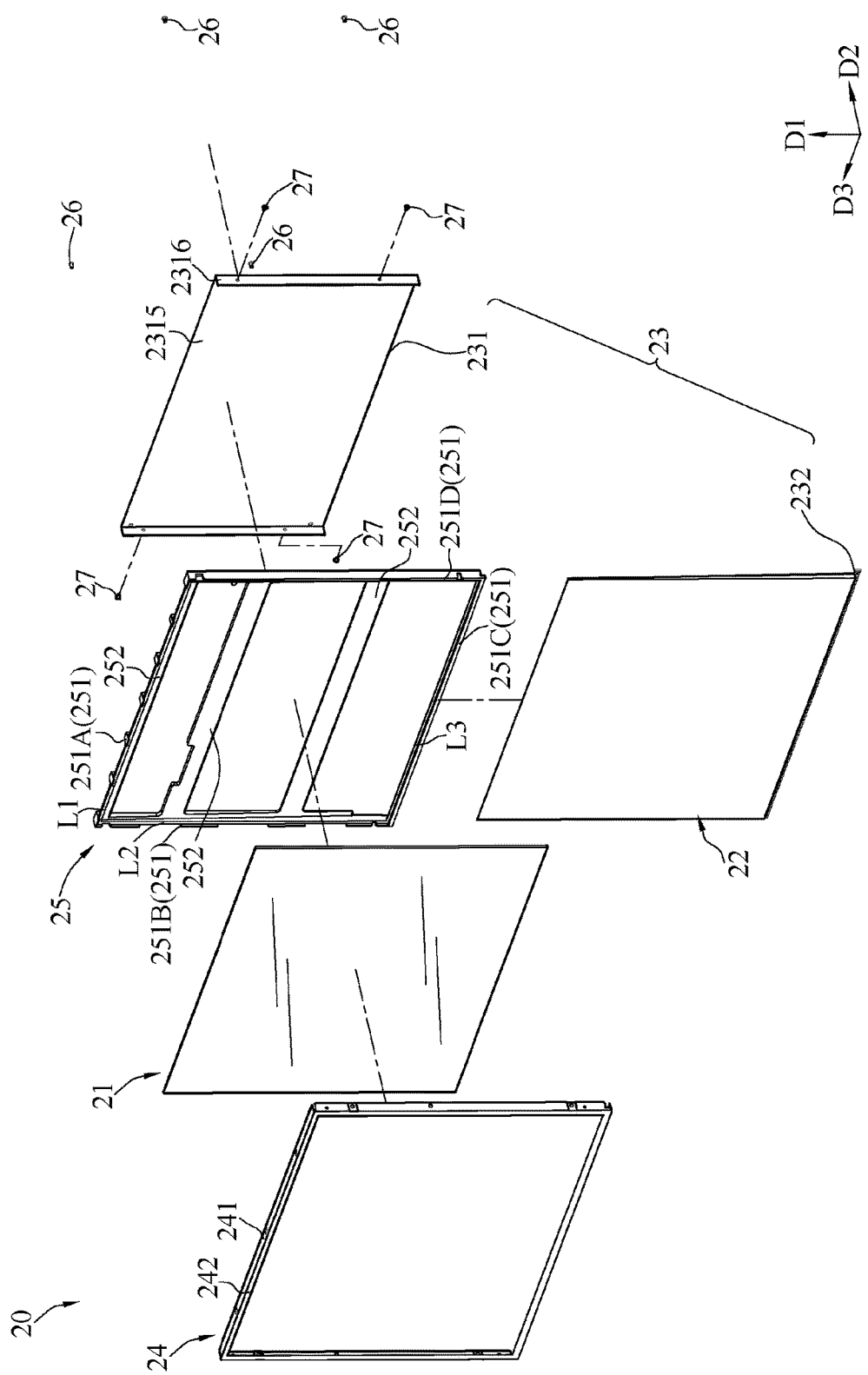
FIG. 4 is an exploded view of the display device of the portable electronic device according to an embodiment of the present invention.
Figure 5:
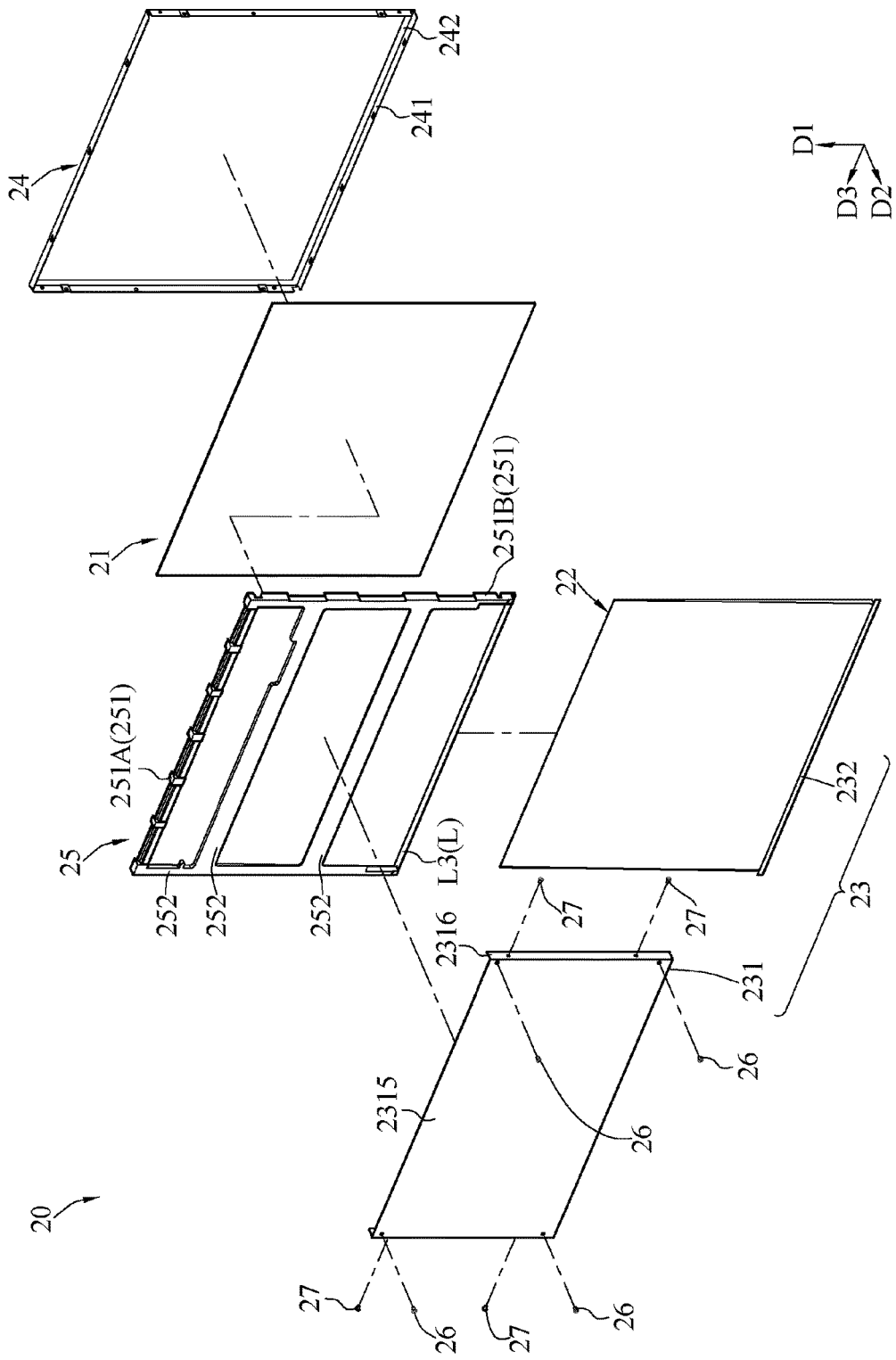
FIG. 5 is an exploded view from a different angle of the display device of the portable electronic device according to an embodiment of the present invention.

FIG. 2 and FIG. 3 are perspective views from different angles of the display device 20 of the portable electronic device according to an embodiment of the present invention, respectively. FIG. 4 and FIG. 5 are exploded views from different angles of the display device 20 according to an embodiment of the present invention, respectively. The display device 20 shown in FIG. 2 through FIG. 5 comprises a display panel 21, an optical module 22, and a heat dissipation module 23. A conventional backlight module has important parts and components, such as a reflector, a light source (CCFL, LED), a light guide, a diffuser, and a prism sheet; and a backlight module not including any light source is hereinafter referred to as the optical module 22. The optical module 22 is superimposed on the display panel 21. The heat dissipation module 23 is superimposed on the optical module 22. The heat dissipation module 23 comprises a vapor chamber 231 and a light-emitting module 232, wherein vapor chambers are also known as flat or planar heat pipes. This embodiment uses a grooved aluminum extrusion as an envelope since an aluminum envelop is more appropriate for big size and mass production than a copper one.

Figure 6:
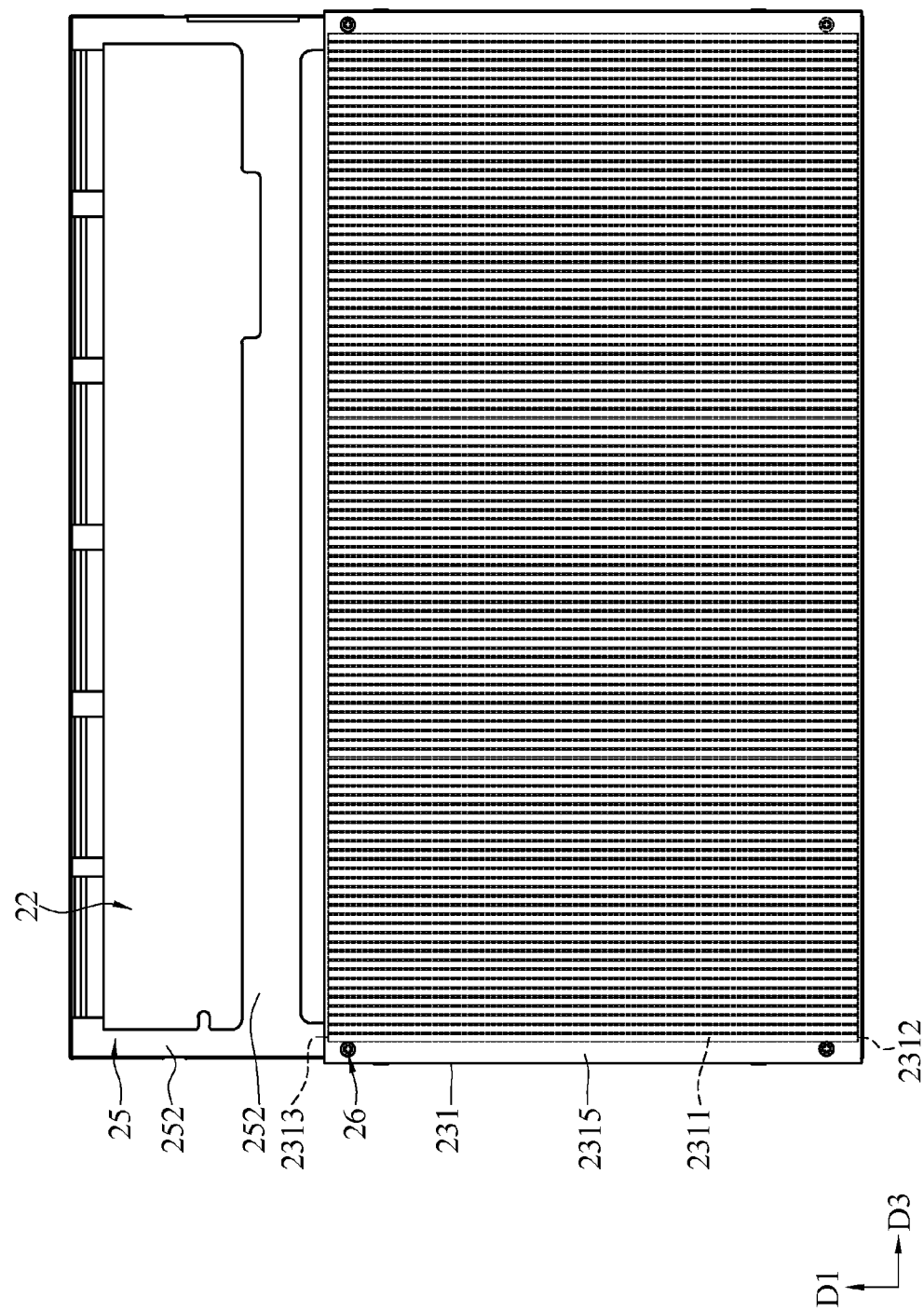
FIG. 6 is a plane of the display device of the portable electronic device according to an embodiment of the present invention.

Referring to FIG. 4, FIG. 5 and FIG. 6, the vapor chamber 231 has a plurality of channels 2311 and a plurality of working fluids undergoing cyclic evaporation and condensation in the channels 2311. The channels 2311 each extend from a bottom edge 2312 of the vapor chamber 231 to a top edge 2313 of the vapor chamber 231. The light-emitting module 232 is disposed at the bottom edge 2312.

The operation of the display device 20 is described below. The light-emitting module 232 of the display device 20 emits a plurality light beams. The plurality of light beams are guided by the optical module 22 to the display panel 21 for displaying images. The light-emitting module 232 of the display device 20 generates heat while the display device 20 is in operation. The working fluids near the light-emitting module 232 take up the heat and thus evaporate, turning into a gas. The gas leaves away from the light-emitting module 232 toward the top edge 2313 and thus condenses, turning into a liquid along the way. The working fluids in the channels 2311 of the vapor chamber 231 operate cyclically and ceaselessly and thereby cool the display device 20.

Referring to FIG. 1 and FIG. 6, in an embodiment, the bottom edge 2312 is closer to the pivotal connection portion 11 than the top edge 2313, and thus the vapor chamber 231 of the display device 20 is pivotally connected to the pivotal connection portion 11 of the body 10 via the display device 20 by the bottom edge 2312. Therefore, as soon as the display device 20 comes close to the body 10, the top edge 2313 and the bottom edge 2312 of the vapor chamber 231 of the display device 20 come close to the body 10 and end up at the same level. To access the portable electronic device, a user turns the display device 20 relative to the body 10 to move the display device 20 away from the body 10 (as shown in FIG. 1), and in consequence the top edge 2313 of the vapor chamber 231 of the display device 20 moves away from the body 10, rendering the vapor chamber 231 upright, with the top edge 2313 being above the bottom edge 2312.

In the aforesaid situation where the vapor chamber 231 is upright, the working fluids in the channels 2311 of the display device 20 spontaneously converge at the bottom edge 2312 under gravity. After the display device 20 has started to operate, the light-emitting module 232 disposed at the bottom edge 2312 of the vapor chamber 231 generates heat. Exchange of thermal energy (heat) between the light-emitting module 232 and the working fluids converging at the bottom edge 2312 occurs and the latter thus evaporate, turning into a gas. The working fluids in their gaseous form rise up to the top edge 2313 of the vapor chamber 231. Along their way or upon their arrival at the top edge 2313 of the vapor chamber 231, the working fluids in their gaseous form condense, turning into their liquid form due to their departure from a heat source. Afterward, the working fluids in their liquid form return to the bottom edge 2312 through gravity where they converge again. Therefore, the orientation of the channels 2311 of the vapor chamber 231 is designed in such a manner that once the display device 20 has being in operation or an open position, the gaseous working fluids will rise up to the top edge 2313 quickly while the liquid working fluids will spontaneously stream down and converge at the bottom edge 2312, where heat is generated, through gravity after evaporating and condensing. By this way, the vapor chamber 231 effectuates heat dissipation optimization by speeding up the circulation of the working fluids between their gaseous and liquid form while the display device 20 is in normal use. Specifically, gravity will compensate for capillary action through which the liquid working fluids return to a heat source, that is, the light-emitting module 232 in this embodiment especially for a grooved aluminum extrusion as an envelope, which capillary action is weaker than that of a copper envelope.

Figure 11:
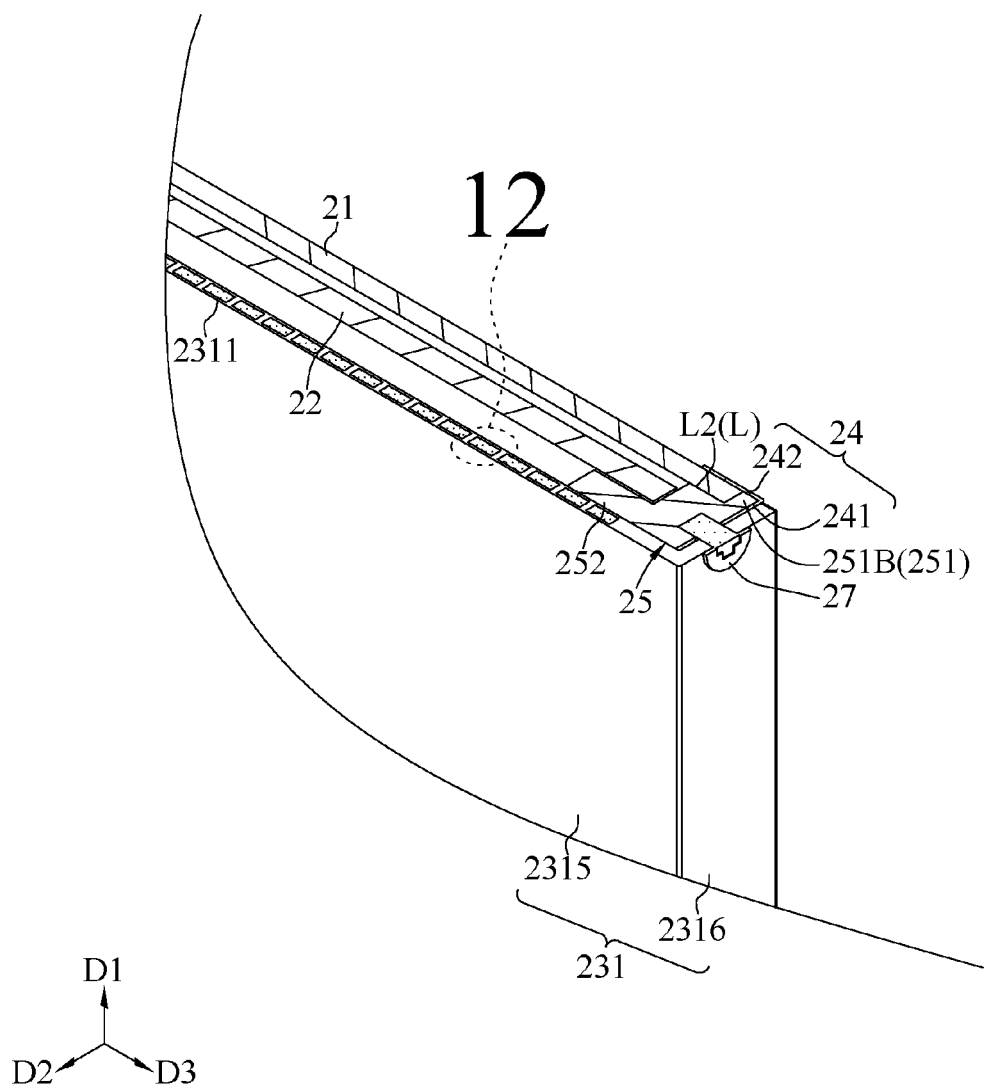
FIG. 11 is a cutaway view along line C-C in FIG. 3.
Figure 12:
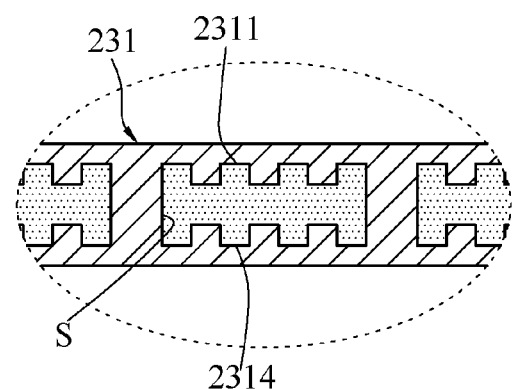
FIG. 12 is a partial enlarged view of circled part 12 in FIG. 11.

Referring to FIG. 11 and FIG. 12, in an embodiment, the vapor chamber 231 is made of a metal. The channels 2311 of the vapor chamber 231 each have an inner annular surface S. The inner annular surface S has a plurality of wick structures 2314. In this embodiment, the wick structures 2314 of the vapor chamber 231 are grooved wicks, which are simultaneously formed along with a grooved aluminum extrusion and therefore extend in the same direction as the channels 2311. The plurality of grooved wick structures run parallel and extend between the bottom edge 2312 and the top edge 2313. When the display device 20 is in use, the channels 2311 and the wick structures 2314 are spontaneously upright and thus are effective in assisting in cyclic evaporation and condensation of the working fluids between their gaseous and liquid form to effectively achieve heat dissipation.

The wick structures 2314 can also be provided in the form of sintered particles, netting, and convoluted microstructure (for example, recess-shaped, cylindrical, coarse, regularly convoluted or irregularly convoluted) in other embodiments. In this embodiment, the vapor chamber 231 is made of aluminum, while the wick structures 2314 are produced by an extrusion process and thus provided in the form of recesses. Physical properties of the material which the vapor chamber 231 is made of, coupled with machining techniques applicable to the vapor chamber 231, render the manufacturing process thereof simple and enhance productivity.

Referring to FIG. 12, there is shown a partial enlarged view of the channels 2311. It is worthwhile mentioning that the size of the wick structures 2314 is exaggerated in the diagram and therefore not drawn to scale for illustrative purposes. As a result, the wick structures 2314 are out of proportion to the channels 2311. The wick structures 2314 are provided in the form of a plurality of square recesses distributed on an inner rim surface S of the channels 2311, but the present invention is not limited thereto.

Referring to FIG. 4 and FIG. 5, in an embodiment, the light-emitting module 232 is an LED array, but the present invention is not limited thereto. The plurality of light beams emitted from the light-emitting module 232 refract as they enter and leave the optical module 22 before being perpendicularly projected onto the display panel 21.

Figure 7:
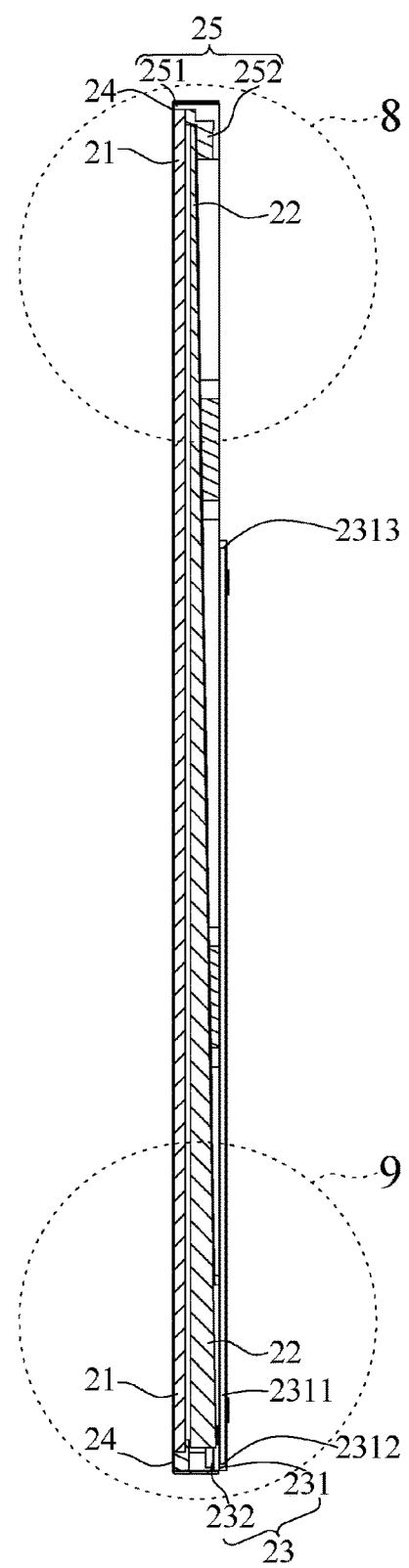
FIG. 7 is a cross-sectional view along line A-A in FIG. 2.

Referring to FIG. 4, FIG. 5 and FIG. 7, in an embodiment, the optical module 22 is a rectangle or prismatic plate with a trapezoidal cross section and thus a thickness which varies continuously, but the present invention is not limited thereto. Specifically, the thickness of the optical module 22 decreases gradually in the direction from the bottom edge 2312 of the vapor chamber 231 to the top edge 2313 of the vapor chamber 231. Particularly, the optical module 22 is a prismatic plate coated with optical films and tapered in thickness toward the top edge 2313.

Referring to FIG. 4, FIG. 5 and FIG. 7, in an embodiment, the display device 20 further comprises a front frame element 24 and a rear frame element 25 to reinforce the display device 20. The front frame element 24 and the rear frame element 25 together allow both the display panel 21 and the optical module 22 to be firmly positioned and allow the vapor chamber 231 to be firmly coupled to the display panel 21 and the optical module 22. The rear frame element 25 has a front bezel 251 and a rear receptacle 252. The display panel 21 is embedded onto the front bezel 251. The optical module 22 is moved in a direction from the bottom edge 2312 to the top edge 2313 and thus inserted into the rear receptacle 252. The front frame element 24 confines the display panel 21 to one side of the rear frame element 25. The vapor chamber 231 is positioned on the other side of the rear frame element 25.

Figure 8:
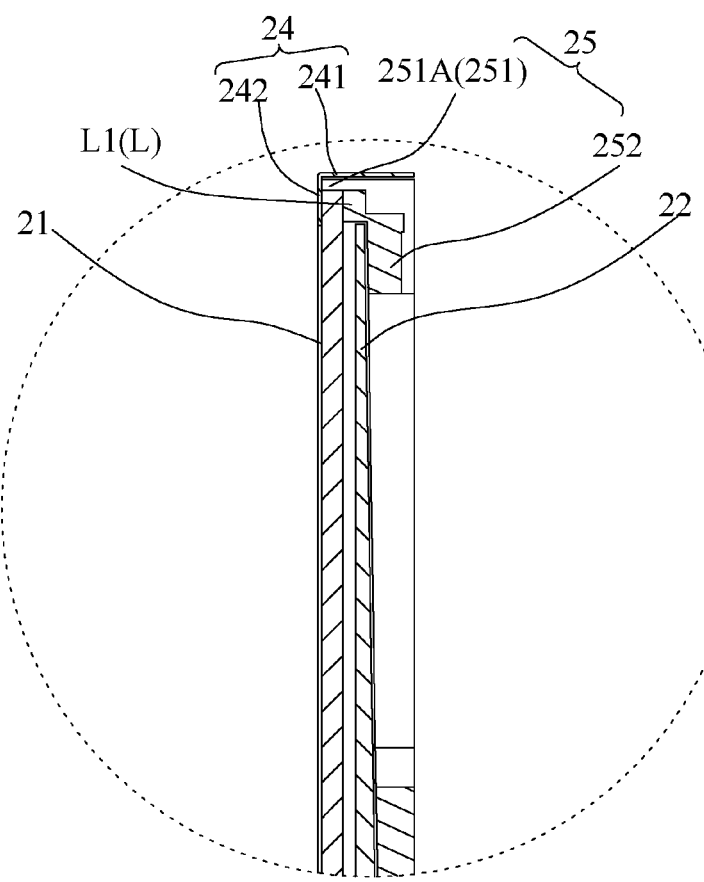
FIG. 8 is a partial enlarged view of circled part 8 in FIG. 7.
Figure 9:
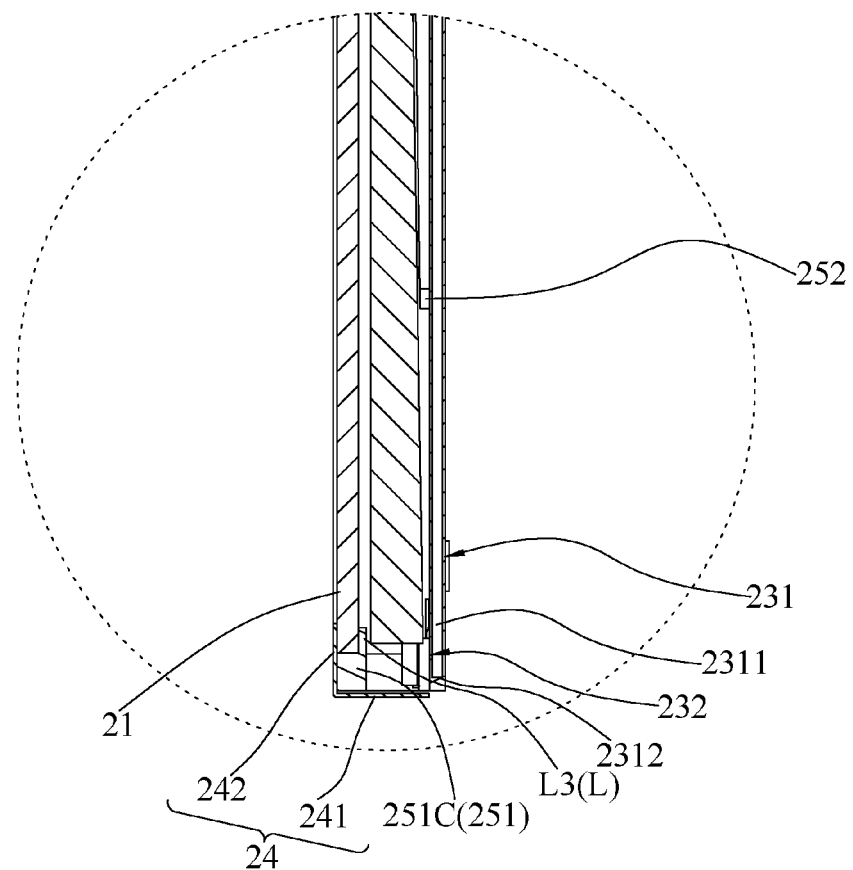
FIG. 9 is a partial enlarged view of circled part 9 in FIG. 7.

Referring to FIG. 4, FIG. 5 and FIG. 8, in an embodiment, the front frame element 24 is a rectangle frame and has a frame side 241 and a frame edge 242. The frame side 241 and the frame edge 242 adjoin each other. The frame side 241 and the frame edge 242 extend from the junction thereof and in different directions. Therefore, an included angle is formed between the frame side 241 and the frame edge 242 and at the junction thereof. The included angle formed at the junction of the frame side 241 and the frame edge 242 corresponds in position to an included angle of the external outline of the display panel 21. The frame edge 242 extends toward the inside of the outline of the frame side 241. Therefore, in this embodiment, the frame edge 242 has a smaller outline than the frame side 241, whereas the external outline of the display panel 21 is larger than the outline of the frame edge 242 but smaller than the outline of the frame side 241. Therefore, the display panel 21 fits inside the outline of the frame side 241 of the front frame element 24 and presses against the frame edge 242, allowing the frame edge 242 to prevent the escape of the display panel 21 from the front frame element 24.

Referring to FIG. 4, FIG. 5 and FIG. 8, in an embodiment, the rear frame element 25 is a rectangle frame. The external outline of the rear frame element 25 is smaller than the outline of the frame side 241 of the front frame element 24 such that the rear frame element 25 fits inside the outline of the frame side 241 of the front frame element 24. The rear frame element 25 has four lines L. The two opposing sides of the lines L are the front side and the rear side, respectively. A plurality of front bezels 251 is disposed at the external outline of the rear frame element 25 and protrudes toward the front side of the lines L.

Referring to FIG. 4, FIG. 5 and FIG. 8, FIG. 9, the front bezel 251 comprises a first front bezel 251A, a second front bezel 251B, a third front bezel 251C, and a fourth front bezel 251D. The lines L includes a first line L1, a second line L2, a third line L3, and a fourth line (as shown in the diagrams, the fourth line is opposite the second line L2 and hidden by the fourth front bezel 251D.) The first line L1 connects with the second line L2 and the fourth line. The third line L3 is opposite the first line L1 and connects with the second line L2 and the fourth line. The first front bezel 251A is disposed at the first line L1. The second front bezel 251B is disposed at the second line L2. The third front bezel 251C is disposed at the third line L3. The fourth front bezel 251D is disposed at the fourth line. This embodiment is characterized by first front bezels 251A spaced apart and disposed at the first line L1, second front bezels 251B spaced apart and disposed at the second line L2, third front bezel 251C continuously disposed at the third line L3, and fourth front bezel 251D continuously disposed at the fourth line. The display panel 21 presses against the front sides of the lines L of the rear frame element 25. The front bezels 251 protruding toward the lines L prevent the escape of the display panel 21 from the rear frame element 25 such that the display panel 21 is embedded onto the front bezel 251. The gaps between the first front bezels 251A spaced apart and the gaps between the second front bezels 251B spaced apart not only facilitate the assembly of the display panel 21 but also facilitate the maintenance and replacement of the assembled display panel 21 by partial exposure.

Referring to FIG. 4, FIG. 5 and FIG. 8, the rear receptacles 252 are disposed at the rear sides of the lines L. The rear receptacles 252 differ from the lines L in height to create gaps separating the rear receptacles 252 from the lines L and receiving the optical module 22. In this embodiment, the rear receptacles 252 are disposed continuously along the first line L1, the second line L2 and the fourth line. The rear receptacles 252 extend between the second line L2 and the fourth line. The rear receptacles 252 disposed between the second line L2 and the fourth line are separated by a distance. The rear receptacles 252 are absent from the rear side of the third line L3. Therefore, the optical module 22 can be inserted into the rear frame element 25 from the rear side of the third line L3. The light-emitting module 232 is disposed at the rear side of the third line L3 of the rear frame element 25 and positioned proximate to the optical module 22. The vapor chamber 231 is superimposed on the optical module 22 in such a manner that the bottom edge 2312 is opposite the light-emitting module 232. The optical module 22 is of a large thickness when corresponding in position to one side of the third line L3 of the rear frame element 25 but is of a small thickness when corresponding in position to the other side of the third line L3 of the rear frame element 25 to ensure that the plurality of light beams emitted from the light-emitting module 232 penetrate the optical module 22 and thus falls perpendicularly on the display panel 21.

Referring to FIG. 4, FIG. 5 and FIG. 6, in an embodiment, to reinforce the display device 20, the vapor chamber 231 comprises a heat-conducting face portion 2315 and a mounting structure 2316. The mounting structure 2316 flanks two opposing sides of the heat-conducting face portion 2315 such that the vapor chamber 231 has a substantially fat, short n-shape. The channels 2311 of the vapor chamber 231 are distributed on the heat-conducting face portion 2315. Therefore, the heat-conducting face portion 2315 of the vapor chamber 231 covers a portion of the rear frame element 25 in such a manner that the portion of the rear frame element 25 is opposite the optical module 22, whereas the mounting structure 2316 flanking the two sides of the heat-conducting face portion 2315 covers the two sides of the front frame element 24. Therefore, the vapor chamber 231 fits around the front frame element 24, increases the restriction on motion of the vapor chamber 231 and the front frame element 24 relative to each other, and enhances overall structural stability.

Referring to FIG. 4 through FIG. 6, in an embodiment, the display device 20 further comprises a plurality of first screwing elements 26 and a plurality of second screwing elements 27. The direction in which the bottom edge 2312 and the top edge 2313 are connected is defined as the first direction D1. The first direction D1 is perpendicular to the second direction D2. Both the first direction D1 and the second direction D2 are perpendicular to the third direction D3.

Figure 10:
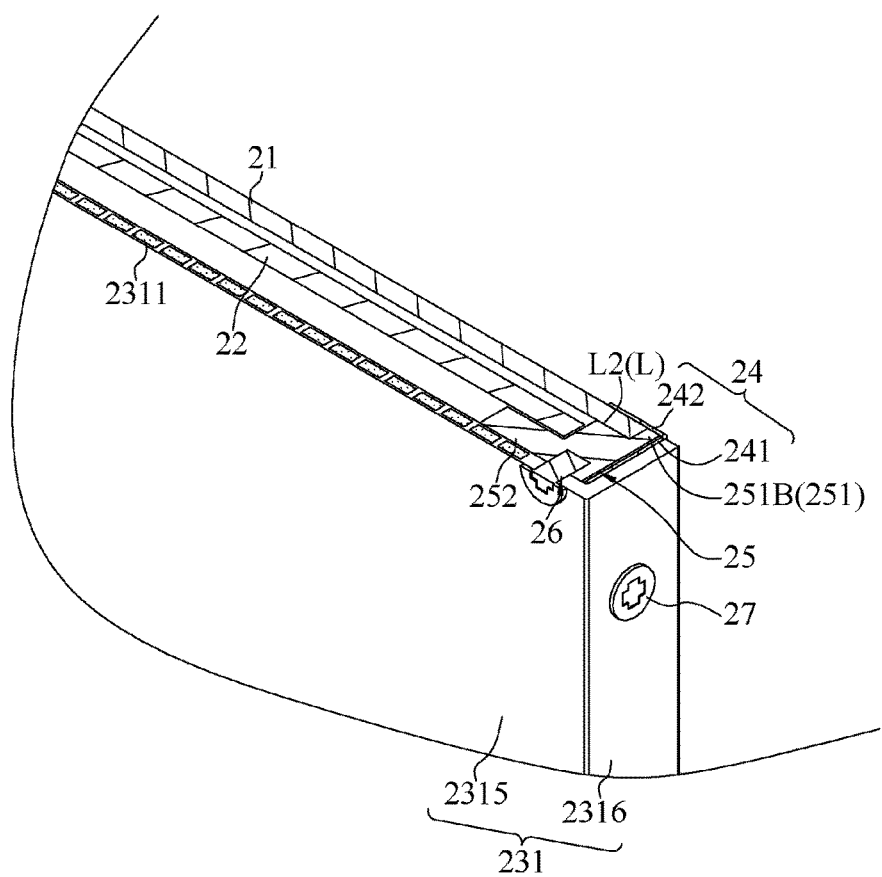
FIG. 10 is a cutaway view along line B-B in FIG. 3.
Figure 10:
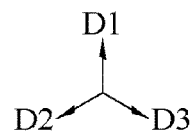

Referring to FIG. 10 and FIG. 11, the first screwing elements 26 move in the second direction D2 to screw the heat-conducting face portion 2315 of the vapor chamber 231 to the vapor chamber 231 and then screw the vapor chamber 231 to the rear frame element 25, whereas the second screwing elements 27 move in the third direction D3 to screw the mounting structure 2316 of the vapor chamber 231 to the vapor chamber 231, then screw the vapor chamber 231 to the frame side 241 of the front frame element 24, and finally screw the front frame element 24 to the rear frame element 25. The display device 20 is reinforced in its entirety, because the first screwing elements 26 and the second screwing elements 27 operate in conjunction with the front frame element 24, the rear frame element 25, and the vapor chamber 231. The first screwing elements 26 and the second screwing elements 27 together facilitate replacement and maintenance of the display panel 21, the light-emitting module 232, and the optical module 22, thereby facilitating subsequent maintenance.

The method of assembling the display device 20 comprises the steps of: coupling the display panel 21 and the optical module 22 to the front frame element 24 and the rear frame element 25, with the front frame element 24 fitted around the rear frame element 25; mounting the light-emitting module 232 in place such that the light-emitting module 232 corresponds in position to the bottom edge 2312 of the vapor chamber 231; and mounting the vapor chamber 231 on the front frame element 24 or the rear frame element 25.

In an embodiment, the step of coupling the display panel 21 and the optical module 22 to the front frame element 24 and the rear frame element 25 entails mounting the display panel 21 and the optical module 22 on the rear frame element 25 and then mounting the front frame element 24, or entails placing the display panel 21 on the front frame element 24 and then mounting the optical module 22 on the rear frame element 25. Hence, the present invention is not restrictive of the order in which the display panel 21 and the optical module 22 are mounted on the rear frame element 25 or the front frame element 24.

To mount the display panel 21 and the optical module 22 in place, the user moves the display panel 21 in the second direction D2 to place the display panel 21 inside the inner outline of the frame side 241 of the front frame element 24 or render the display panel 21 embedded onto the front bezels 251 of the rear frame element 25. The frame side 241 of the front frame element 24 ensures that the display panel 21 only moves in the first direction D1 and the third direction D3. The front bezels 251 of the rear frame element 25 ensure that the display panel 21 only moves in the first direction D1 and the third direction D3.

The optical module 22 is moved from the rear side of the third line L3 and moved in the first direction D1 before being inserted into the space between the Lines L and the rear receptacles 252 of the rear frame element 25. The Lines L and the rear receptacles 252 of the rear frame element 25 ensure that the optical module 22 only moves in the second direction D2. As indicated above, the display panel 21 and the optical module 22 differ in the direction in which they are moved with a view to being mounted on the rear frame element 25; hence, the present invention is not restrictive of the order in which the display panel 21 and the optical module 22 are mounted in place, and thus the display panel 21 and the optical module 22 can be freely mounted in place. Furthermore, the display panel 21 and the optical module 22 can be demounted separately rather than simultaneously, as needed, thereby enhancing ease of use.

The step of mounting the light-emitting module 232 in place and allowing the light-emitting module 232 to correspond in position to the bottom edge 2312 of the vapor chamber 231 is achieved by fixing the light-emitting module 232 directly to the vapor chamber 231 or the rear frame element 25.

With the display panel 21 and the optical module 22 being confined to the front frame element 24 and the rear frame element 25, the front frame element 24 ensures that the rear frame element 25 moves in the first direction D1 and the third direction D3 as soon as the front frame element 24 fits around the rear frame element 25. Finally, the vapor chamber 231 is mounted on the front frame element 24 or the rear frame element 25, thereby facilitating assembly and positioning.

After fitting around the already-coupled front and rear frame elements 24, 25, the vapor chamber 231 is moved in the second direction D2 and thus screwed to the rear frame element 25 by the first screwing elements 26, allowing the vapor chamber 231 and the rear frame element 25 to be mounted in place. Furthermore, the vapor chamber 231 is moved in the third direction D3 and thus screwed to the front frame element 24 and the rear frame element 25 sequentially by the second screwing elements 27. Therefore, the vapor chamber 231 is coupled firmly to the front frame element 24 and the rear frame element 25.

In conclusion, the portable electronic device of the present invention has advantages as follows: heat generated from the display device 20 is dissipated by the heat dissipation module 23 of the display device 20; working fluids of the heat dissipation module 23 take up the heat and undergo cyclic evaporation and condensation to effectuate heat dissipation; and the display device 20 in normal use assists the working fluids in circulating quickly, allowing the heat dissipation module 23 to achieve optimal heat conduction.

What is claimed is:

1. A portable electronic device, comprising:
   a body having a pivotal connection portion; and
   a display device pivotally connected to the pivotal connection portion, comprising:
      a display panel;
      an optical module superimposed on the display panel; and
      a heat dissipation module superimposed on the optical module, comprising:
         a vapor chamber having a plurality of channels and a plurality of working fluids capable of undergoing cyclic evaporation and condensation in the plurality of channels, the plurality of channels each extending from a bottom edge of the vapor chamber to a top edge of the vapor chamber;
         a light-emitting module disposed at the bottom edge;
      a front frame element and a rear frame element, the rear frame element having a front bezel and a rear receptacle, with the display panel embedded onto the front bezel, wherein the optical module is inserted into the rear receptacle, and the front frame element is coverinqly disposed at the rear frame element and presses against the display panel;

a plurality of first screwing elements screwing the vapor chamber and the rear frame element together; and a plurality of second screwing elements screwing the vapor chamber, the front frame element, and the rear frame element together sequentially.

2. The portable electronic device of claim 1, wherein the bottom edge is closer to the pivotal connection portion than the top edge such that, and the heat dissipation module is arranged such that when the display device rotates relative to the body and moves away from the body, the plurality of working fluids at the bottom edge takes up heat of the light-emitting module and thus evaporates into a gas which rises and moves toward the top edge, then the gas dissipates heat during its movement toward the top edge and thus condenses into liquid, and finally the liquid converges again at the bottom edge under gravity.

3. The portable electronic device of claim 1, wherein a thickness of the optical module is tapered from the bottom edge to the top edge, and a light beam emitted from the light-emitting module is perpendicularly projected onto the display panel by the optical module.

4. The portable electronic device of claim 1, wherein the front frame element has a frame side and a frame edge, with an included angle formed between the frame side and the frame edge, allowing an outline of the display panel to lie within an outline of the frame side, and allowing an outline of the frame edge to lie within the outline of the display panel.

5. The portable electronic device of claim 1, wherein a mounting structure is disposed at each of two opposing sides of the vapor chamber and fixed to one of the front frame element and the rear frame element.

6. The portable electronic device of claim 1, wherein a direction in which the bottom edge and the top edge are connected is defined as a first direction, and the plurality of first screwing elements is screwingly disposed along a second direction perpendicular to the first direction.

7. The portable electronic device of claim 1, wherein the plurality of second screwing elements is screwingly disposed along a third direction perpendicular to the first direction and the second direction.

\* \* \* \* \*